US007214610B2

(12) United States Patent
Hahn et al.

(10) Patent No.: US 7,214,610 B2
(45) Date of Patent: May 8, 2007

(54) PROCESS FOR PRODUCING ALUMINUM-FILLED CONTACT HOLES

(75) Inventors: Jens Hahn, Dresden (DE); Sven Schmidbauer, Dresden (DE)

(73) Assignee: Infineon Technologies AG, Munich (DE)

( * ) Notice: Subject to any disclaimer, the term of this patent is extended or adjusted under 35 U.S.C. 154(b) by 244 days.

(21) Appl. No.: 10/768,241

(22) Filed: Jan. 30, 2004

(65) Prior Publication Data

US 2004/0242007 A1  Dec. 2, 2004

(30) Foreign Application Priority Data

Jan. 31, 2003  (DE) ................................ 103 04 103

(51) Int. Cl.
*H01L 21/4763* (2006.01)
(52) U.S. Cl. ...................... 438/637; 438/639; 438/680; 257/E21.585
(58) Field of Classification Search ...................... None
See application file for complete search history.

(56) References Cited

U.S. PATENT DOCUMENTS

| 5,186,718 | A | * | 2/1993 | Tepman et al. ............ 29/25.01 |
| 5,677,238 | A | | 10/1997 | Gn et al. |
| 6,140,228 | A | | 10/2000 | Shan et al. |
| 6,334,249 | B2 | | 1/2002 | Hsu |
| 6,398,929 | B1 | * | 6/2002 | Chiang et al. ......... 204/298.11 |
| 6,455,427 | B1 | | 9/2002 | Lau |
| 6,709,971 | B2 | * | 3/2004 | Kozhukh et al. ........... 438/622 |
| 2002/0016050 | A1 | | 2/2002 | Weber et al. |

OTHER PUBLICATIONS

Lee, J.M., et al., "A Noble Metallization Process Using Preferential Metal Deposition (PMD)—Aluminum with Methylpyrroridine Alane (MPA)," Proceedings of the International Interconnect Conference, Jun. 4-6, 2001.
Yun, J.H., et al., "Submicron Via-Hole Filling using Al Low-Pressure Seed Process," Jpn. J. Appl. Phys. vol. 40 (2001) pp. 5105-5108.

* cited by examiner

*Primary Examiner*—Michael Lebentritt
*Assistant Examiner*—Cheung Lee
(74) *Attorney, Agent, or Firm*—Slater & Matsil, L.L.P.

(57) ABSTRACT

A process for producing aluminum-filled contact holes in a wafer is disclosed. The process uses a coating installation that includes a plurality of vacuum-processing chambers that are coupled to one another via at least one transfer chamber with an associated handler for transferring the wafers. The preferred process including forming the contact holes and depositing a barrier layer. The wafer is cooled to ambient temperature. A cold aluminum PVD coating process can then be carried out in a PVD-aluminum ESC chamber. After the wafer is heated (e.g., to a temperature of less than about 450° C.), a hot aluminum PVD deposition process is carried out in the PVD-aluminum ESC chamber.

18 Claims, 2 Drawing Sheets

PROCESS FOR PRODUCING ALUMINUM-FILLED CONTACT HOLES

TECHNICAL FIELD

The present invention relates to a process for producing aluminum-filled contact holes in a wafer.

BACKGROUND

Semiconductor arrangements formed in a wafer, such as for example memory devices, logic device, processors and others, generally have a plurality of metallization levels that are electrically connected to one another via metal contacts. Lithography processes in combination with subsequent RIE (Reactive Ion Etching) or similar processes are used to produce metal contacts of this type. Therefore, the lithography processes produce etching masks on the substrate, so that contact holes can then be etched into the substrate through the etching masks by means of RIE, extending down as far as the next metallization level.

In principle, it is possible for the contact holes to be completely filled with tungsten by means of an M-CVD (modified chemical vapor deposition) process. However, this requires prior deposition of TiN, and then a polishing step (CMP) after the tungsten CVD process. Drawbacks of filling the contact holes with tungsten are the relatively high contact resistance and the technological outlay.

It would be more advantageous for the contact holes to be filled with aluminum. Aluminum contacts of this type would have a significantly lower contact resistance. Various processes have been proposed and used in practice for the production of aluminum contacts of this type.

By way of example, this has been done by Lee, et al. (J. M. Lee, B. H. Kim, J. Y. Yun, M. B. Lee, G. H. Choi, Y. W. Park, H. K. Shin, S. I. Lee, J. T. Moon, "A Noble Metallization Process Using Preferential Metal Deposition (PMD)—Aluminum with Methylpyrroridine Alane (MPA)," Proceedings of the International Interconnect Conference, Jun. 4–6, 2001) by depositing a very thin PVD (physical vapor deposition) layer of MPA at the surface (not in the contact hole). A subsequent CVD aluminum layer then grows only in the contact hole. Finally, the contact hole is filled using a PVD reflow process at moderate temperatures.

Since the CVD-Al layer, which is in this case required to flow, is not on a planar surface, its height is not increased by the roughness of the reflow aluminum. The drawback of this process, however, is that it is a very complex procedure that requires various process steps that take place very slowly.

Another process is described by Yun, et al. (J. H. Yun, K. Y. Kim, S. G. Jin, K. R. Yoon, S. H. Lee, I. C. Ryu, S. K. Park, "Submicron Via-Hole Filling using Al Low-Pressure Seed Process," Jpn. J. Appl. Phys. Vol. 40 (2001) pp. 5105–5108, Part I, No. 8, August 2001). This process uses a commercially available coating installation produced by Applied Materials with the process intended for the installation to fill contact holes in a wafer with aluminum.

In this case, a 400 nm thick aluminum nucleation layer is deposited in vacuo in a separate chamber (long throw technique) while the wafer is on a cooled electrostatic chuck (ESC). The actual filling process is then carried out at temperatures of 450° C. in a further aluminum PVD chamber in vacuo after a heating time of 120 s, with a very low deposition rate at a sputtering power of 2 kW. This means that the filling of the contact holes (vias) with aluminum is carried out in two steps in different vacuum chambers, with a handler being used to transfer the wafers from chamber to chamber.

A handler is to be understood as meaning a device for transferring wafers from a magazine of a loading station (e.g., a FOUP or Front Opening Unified Pod) into a chamber and from the latter into further chambers and ultimately back into a further magazine of the loading station. This handler is arranged in an evacuable transfer chamber located between the processing chambers.

The drawback in this case is that two different aluminum coating chambers are required, with the associated increase in time required to transfer the wafers and the need for the required process parameters in the corresponding chamber to be reset after each transfer, as well as the very slow aluminum flow process.

SUMMARY OF THE INVENTION

The preferred embodiment of the present invention provides a process for producing aluminum-filled contact holes that allows the filling particularly of steep contact holes, e.g., with a diameter of less than about 250 nm and a contact depth of greater than about 300 nm, to be carried out reliably, quickly and therefore at low cost without affecting the subsequent patterning of metal tracks by means of RIE integration including the lithography process which this requires.

In a process of the type described in the introduction, the preferred embodiment of the present invention is achieved by virtue of the fact that the wafer is first cooled to ambient temperature, e.g., between about 15° C. to 40° C., and that a cold aluminum PVD coating is then carried out in a PVD-aluminum ESC chamber. Next, after the wafer has been heated to a temperature of less than about 450° C., hot aluminum PVD deposition is carried out in the same PVD-aluminum ESC chamber.

Embodiments of the invention include the implementation of a cooling and a heating step using simple means during the coating sequence, without the need for a separate aluminum coating chamber and the expensive low-temperature electrostatic chucks in the ALPS chamber and the titanium chamber.

In an advantageous refinement of the invention, the wafer is cooled while it is being transferred in the transfer chamber. For example, the wafer can be cooled as a result of a gas being introduced into the transfer chamber.

Embodiments of the invention therefore satisfy the temperature budget by virtue of the transfer chamber, after simple conversion, being used as a cooling station and the aluminum coating being carried out in a chamber which includes a heating step between cold deposition and hot deposition. This allows a considerable increase in the coating rate, resulting in considerable cost savings.

In one configuration of the invention, the wafer is chucked in the PVD-aluminum ESC chamber without back-surface gas and is subjected to cold aluminum deposition followed by hot deposition with hot back-surface gas, the deposition of the aluminum being carried out with a high deposition rate of greater than about 5 nm.

In a particular embodiment, the present invention relates to a process for producing aluminum-filled contact holes in a wafer using a coating installation comprising a plurality of vacuum-processing chambers that are coupled to one another via at least one transfer chamber with an associated handler for transferring the wafers, in which, after the patterning of the contact holes using a CVD or PVD process, a thin titanium or titanium and titanium nitride layer is deposited. The preferred embodiment is intended to provide processes for producing aluminum-filled contact holes in which the filling of contact holes, particularly steep contact holes, e.g., with a diameter of less than about 250 nm and a contact depth of greater than about 300 nm can be carried out reliably, quickly and therefore inexpensively without affecting the subsequent patterning of metal tracks by means of RIE integration including the lithography process which this requires. According to aspects of the invention, this is implemented by virtue of the fact that the wafer is first cooled to ambient temperature, and cold aluminum PVD coating is then carried out in a PVD-aluminum ESC chamber. Next, after the wafer has been heated to a temperature of less than about 450° C., hot aluminum PVD deposition is carried out in the same PVD-aluminum ESC chamber. The cooling of the wafer preferably takes place while it is being transferred in the transfer chamber.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
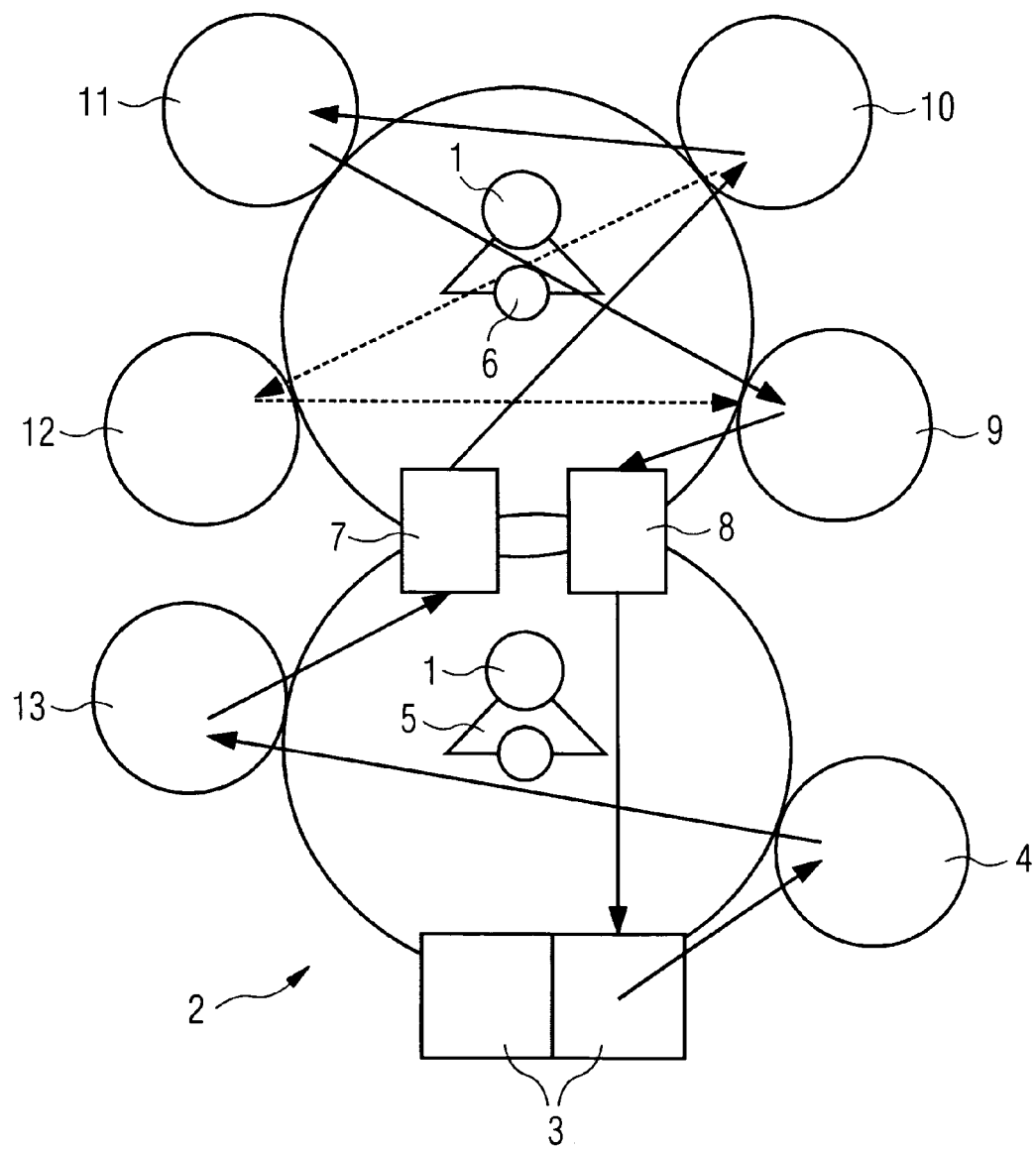
FIG. 1 shows a coating installation comprising a plurality of vacuum-processing chambers which are coupled to one another via transfer chambers with associated handlers for transferring the wafers through the coating installation.

FIG. 1 shows the transfer path of a wafer 1 through a coating installation 2 for aluminum metallization for microelectronic applications. For this purpose, the wafer 1 is conveyed out of a loading station 3 into a wafer-orienting apparatus 4, in which a degassing step is carried out at the same time. Two handlers 5, 6, which are intended to load/unload the devices arranged around them, are responsible for transporting the wafer 1. Two transfer chambers 7, 8 are arranged between the handlers 5, 6, as a temporary resting place for the wafers 1. The wafer 1 can then be transported from the transfer chambers 7, 8 into a PVD-titanium nitride chamber 9, a PVD-titanium chamber 10 and into PVD-aluminum ESC chambers 11, 12 in accordance with the intended sequence. The wafers 1 are transported back to the loading station 3 in a corresponding way. The various transport paths for the wafer 1 can be seen from FIG. 1.

To allow the process for producing aluminum-filled contact holes 14 (FIG. 2) to be carried out, first one of the two transfer chambers 8 or 9 is converted so that a gas-cooling step can be carried out.

Table 1 illustrates some of the processing steps and the corresponding hardware to implement these steps.

TABLE 1

| | Process step | Hardware |
|---|---|---|
| 1 | Degassing | wafer-orienting apparatus 4 |
| 2 | Pre-cleaning with argon | pre-cleaning chamber 13 |
| 3 | Cooling of the wafer 1 | transfer chamber 7 |
| 4 | Titanium (or Ti/TiN) deposition | PVD-titanium chamber 10 |
| 5 | Multi-step aluminum coating | PVD aluminum ESC chambers 11, 12 |

The wafer 1 is transferred into the PVD-titanium nitride chamber 9 and titanium nitride is deposited thereon. During the multi-step aluminum coating, the wafer is first chucked on the ESC (electrostatic chuck) of the PVD-aluminum ESC chamber 11 without back-surface gas. Cold aluminum PVD coating is then carried out. Next comes a heating step, e.g., of about 15 seconds, with back-surface gas. Hot deposition of aluminum at a high deposition rate in the same aluminum ESC chamber 11 can then be performed 4 e.g., at a temperature less than about 450° C.

Figure 2:
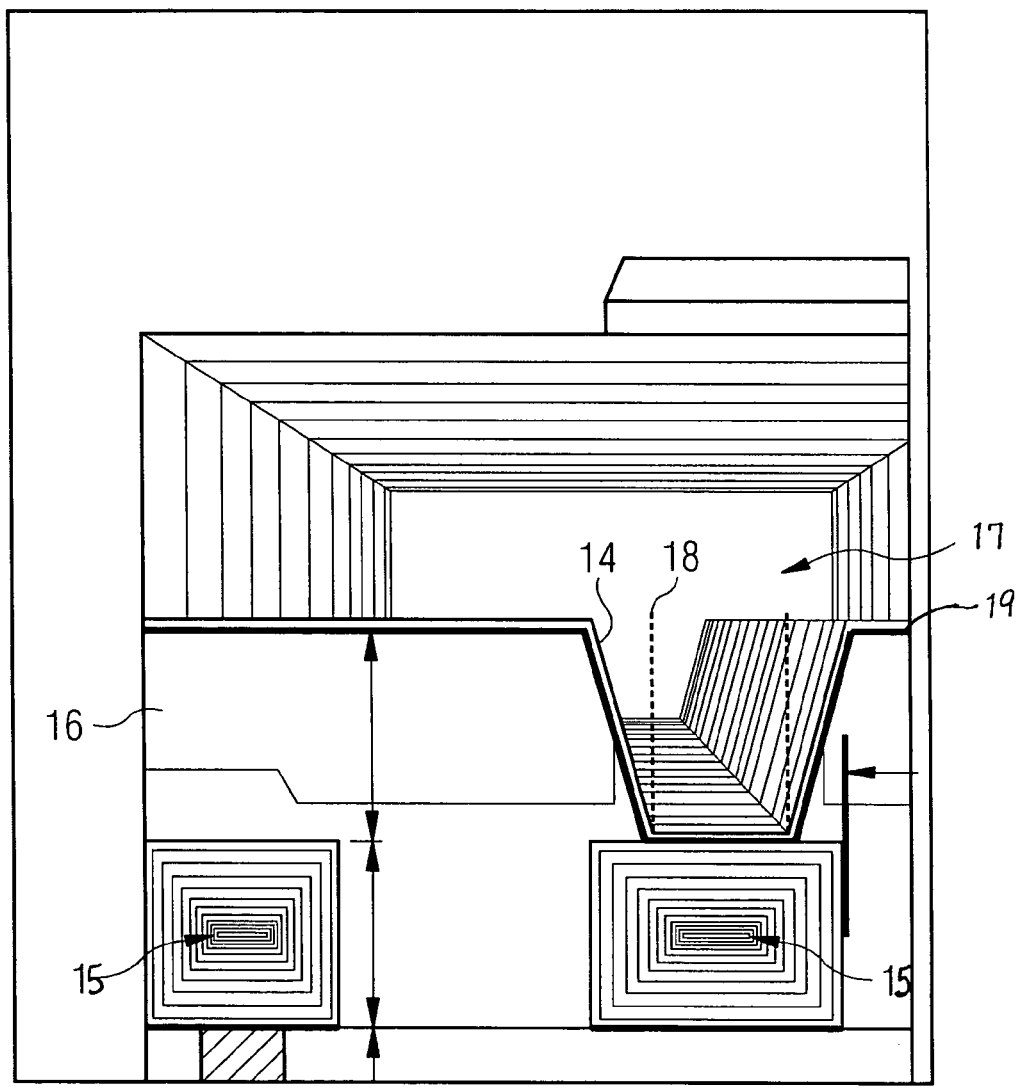
FIG. 2 represents a diagrammatic sectional illustration through an aluminum-filled via.

FIG. 2 diagrammatically depicts a section through a contact hole 14 which has been filled with aluminum or AlCu using the process according to the present invention so as to connect the metallization level-I 15 to the metallization level-II 17 through the interlayer dielectric 16 and over barrier layer 19, e.g., Ti or Ti/TiN. It is then possible without problems for an inclined contact hole 14 and also a very steep contact hole 18 to be filled with aluminum. It is understood that the metallization level-I 15 and metallization level-II 17 can be any two sequential metal levels (e.g., metal 1 and metal 2, or metal 5 and metal 6). It is also possible to connect to two non-sequential metal levels.

Summarizing, the preferred embodiment of the invention provides a process for producing aluminum-filled contact holes in a wafer using a coating installation comprising a plurality of vacuum-processing chambers that are coupled to one another via at least one transfer chamber with an associated handler for transferring the wafers, in which, after the patterning of the contact holes using a CVD process, first a thin titanium or titanium and titanium nitride layer is deposited. This aspect of the invention is characterized in that the wafer 1 is first cooled to ambient temperature, and in that cold aluminum PVD coating is then carried out in a PVD-aluminum ESC chamber 11, 12. Next, after the wafer 1 has been heated to a temperature of less than about 450° C., hot aluminum PVD deposition is carried out in the same PVD-aluminum ESC chamber 11, 12.

Further aspects can be characterized in that the wafer 1 is cooled while it is being transferred in the transfer chamber 7, 8. For example, the wafer 1 can be cooled as a result of a gas being introduced into the transfer chamber 7, 8. Other aspects of the invention are characterized in that the wafer 1 is chucked on a thermal chuck in a PVD-aluminum ESC chamber 11, 12, without back-surface gas and is subjected to cold aluminum deposition followed by hot deposition with hot back-surface gas. Any of these aspects can be characterized in that aluminum is deposited at a high deposition rate.

Table 2 provides a list of reference symbols from the specification.

TABLE 2

| 1 | wafer |
|---|---|
| 2 | coating installation |
| 3 | loading station |
| 4 | wafer-orienting apparatus |

TABLE 2-continued

| | |
|---|---|
| 5 | handler |
| 6 | handler |
| 7 | transfer chamber |
| 8 | transfer chamber |
| 9 | PVD-titanium nitride chamber |
| 10 | PVD-titanium chamber |
| 11 | PVD-aluminium ESC chamber |
| 12 | PVD-aluminium ESC chamber |
| 13 | pre-cleaning chamber |
| 14 | contact hole (via) |
| 15 | metallization level I |
| 16 | interlayer dielectric |
| 17 | metallization level II |
| 18 | steep contact hole |
| 19 | barrier layer |

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A process producing aluminum-filled contact holes in a wafer, the process using a coating installation that includes a plurality of vacuum-processing chambers that are coupled to one another via at least one transfer chamber with an associated handler for transferring the wafer, the process comprising:
   forming the contact holes in a dielectric layer;
   depositing a barrier layer over the wafer and in the contact holes;
   cooling the wafer to ambient temperature, wherein cooling the wafer comprises cooling the wafer while the wafer is being transferred in the transfer chamber;
   cold aluminum PVD coating the wafer, the coating being carried out in a PVD-aluminum ESC chamber;
   heating the wafer to a temperature of less than about 450° C.; and
   carrying out a hot aluminum PVD deposition in the PVD-aluminum ESC chamber, wherein the hot aluminum PVD deposition step is performed after the cold aluminum PVD coating step without intervening deposition steps and wherein the hot aluminum deposition step fills the contact holes.

2. The process of claim 1 wherein cooling the wafer comprises introducing a gas into the transfer chamber.

3. The process of claim 1 wherein the wafer is chucked on a thermal chuck in the PVD-aluminum ESC chamber without back-surface gas and is subjected to cold aluminum deposition followed by hot deposition with hot back-surface gas.

4. The process of claim 1 wherein aluminum is deposited at a high deposition rate.

5. The process of claim 1 wherein the barrier Layer comprises titanium.

6. The process of claim 5 wherein the barrier layer comprises titanium and titanium nitride.

7. The process of claim 1 wherein the filled contact holes are formed using a CVD process.

8. The process of claim 1 wherein the heating of the wafer takes about 15 seconds.

9. A method for forming an aluminum conductor, the process comprising:
   forming a dielectric layer over a wafer;
   forming at least one opening in the dielectric layer;
   placing the wafer in a coating installation;
   after placing the wafer in a coating installation, degassing the wafer;
   after degassing the wafer, pre-cleaning the wafer;
   after pre-cleaning the wafer, cooling the wafer;
   after cooling the wafer, forming a barrier layer over the wafer including within the at least one opening; and
   after forming the barrier layer, performing a two-step aluminum coating in a single process chamber to fill the opening with aluminum, the two-step aluminum coating including a cold aluminum physical vapor deposition process followed by a hot aluminum physical vapor deposition process and without intervening deposition processes.

10. The method of claim 9 wherein placing the wafer in a coating installation comprises placing the wafer in a coating installation that comprises a housing and number of components within the housing, the components comprising:
   a wafer orienting apparatus;
   a pre-cleaning chamber;
   a transfer chamber;
   a PVD-titanium chamber; and
   the single process chamber, the single process chamber comprising a PVD-aluminum chamber.

11. The method of claim 10 wherein the degassing is performed in the wafer orienting apparatus, the pre-cleaning is performed in the pre-cleaning chamber, the cooling is performed in the transfer chamber, the forming a barrier layer is performed in the PVD-titanium chamber, and the multi-step aluminum coating is performed in the PVD-aluminum chamber.

12. The method of claim 9 wherein pre-cleaning comprises pre-cleaning with argon.

13. The method of claim 9 wherein performing the two-step aluminum coating process comprises:
   chucking the wafer on a thermal chuck in the PVD-aluminum chamber without back-surface gas;
   subjecting die wafer to cold aluminum deposition; and
   subjecting the wafer to hot aluminum deposition with hot back-surface gas.

14. The method of claim 9 and further comprising forming a barrier layer after forming at least one opening but before performing the two-step aluminum coating.

15. The process of claim 14 wherein the barrier layer comprises at least one material selected from the group consisting of titanium and titanium nitride.

16. A method for forming an aluminum conductor, the process comprising:
   providing a wafer;
   forming a dielectric layer over the wafer;
   forming at least one opening in the dielectric layer;
   cooling the wafer; and
   after cooling the wafer, performing a two-step aluminum coating in a single process chamber to fill the opening with aluminum, the two-step aluminum coating including a cold aluminum physical vapor deposition process followed by a hot aluminum physical vapor deposition process and without any intervening deposition processes.

17. The method of claim 16 wherein cooling the wafer comprises cooling the wafer while the wafer is being transferred in a transfer chamber.

18. The method of claim 17 wherein cooling the wafer comprises introducing a gas into the transfer chamber.

* * * * *

UNITED STATES PATENT AND TRADEMARK OFFICE
CERTIFICATE OF CORRECTION

PATENT NO. : 7,214,610 B2 Page 1 of 1
APPLICATION NO. : 10/768241
DATED : May 8, 2007
INVENTOR(S) : Hahn et al.

It is certified that error appears in the above-identified patent and that said Letters Patent is hereby corrected as shown below:

Column 6, line 39; delete "die" insert --the--

Signed and Sealed this

Third Day of July, 2007

JON W. DUDAS
*Director of the United States Patent and Trademark Office*